(12) United States Patent
Watanabe et al.

(10) Patent No.: US 12,431,306 B2
(45) Date of Patent: Sep. 30, 2025

(54) SWITCH DEVICE

(71) Applicant: KABUSHIKI KAISHA TOKAI RIKA DENKI SEISAKUSHO, Aichi (JP)

(72) Inventors: Itaru Watanabe, Aichi (JP); Takao Imai, Aichi (JP); Masanori Fujii, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 321 days.

(21) Appl. No.: 18/188,985

(22) Filed: Mar. 23, 2023

(65) Prior Publication Data

US 2023/0307198 A1  Sep. 28, 2023

(30) Foreign Application Priority Data

Mar. 24, 2022  (JP) .................................. 2022-047725

(51) Int. Cl.
| | | |
|---|---|---|
| *H01H 9/16* | (2006.01) | |
| *H01H 9/00* | (2006.01) | |
| *H01H 21/22* | (2006.01) | |
| *H01H 23/28* | (2006.01) | |
| *H01H 63/38* | (2006.01) | |

(52) U.S. Cl.
CPC .......... *H01H 21/22* (2013.01); *H01H 9/0033* (2013.01); *H01H 9/16* (2013.01); *H01H 23/28* (2013.01); *H01H 63/38* (2013.01); *H01H 2009/0061* (2013.01)

(58) Field of Classification Search
CPC ........ H01H 9/0033; H01H 9/16; H01H 9/167; H01H 2009/0061; H01H 23/28; H01H 63/36; H01H 63/38; H01H 63/40; H01H 71/04; H01H 2071/042; H01H 2071/046
See application file for complete search history.

(56) References Cited

U.S. PATENT DOCUMENTS

| | | | | |
|---|---|---|---|---|
| 4,629,976 A | * | 12/1986 | Pipkorn | ............... G01R 19/155 324/133 |
| 5,488,323 A | * | 1/1996 | Beacham, Jr. | ......... H01H 9/167 324/500 |
| 2020/0233449 A1 | * | 7/2020 | Izzo | ....................... H03M 11/24 |

FOREIGN PATENT DOCUMENTS

| | | |
|---|---|---|
| JP | 2009-212047 A | 9/2009 |
| JP | 2011-86497 A | 4/2011 |

* cited by examiner

*Primary Examiner* — Levi Gannon
(74) *Attorney, Agent, or Firm* — Studebaker Brackett PLLC

(57) ABSTRACT

A switch device includes an operation unit to receive an operation performed by a user, a movable contact that is connected to a ground circuit and moves according to an operation performed on the operation unit, plural fixed contacts whose state of connection to the movable contact is switched according to an operation position of the operation unit, plural resistors connected in series in such a manner that one end is connected to a power supply, another end is connected to one of the plural fixed contacts, and a node formed by connecting in series is connected to the remaining of the plural fixed contacts, and a control unit that includes an input terminal connected to a first node between the fixed contact connected closest to the power supply and the resistor and determines the operation position of the operation unit based on voltage detected through the input terminal.

8 Claims, 3 Drawing Sheets

SWITCH DEVICE

CROSS-REFERENCE TO RELATED APPLICATIONS

The present patent application claims the priority of Japanese patent application No. 2022/047725 filed on Mar. 24, 2022, and the entire contents of Japanese patent application No. 2022/047725 are hereby incorporated by reference.

TECHNICAL FIELD

The present invention relates to a switch device.

BACKGROUND ART

A toggle switch is known which has a common contact, two fixed contacts, and three terminals electrically connected to the common contact and the two fixed contacts (see, e.g., Patent Literature 1).

In the toggle switch, the state of connection of the common contact to the two fixed contacts is switched by an operation performed on an operating handle.

CITATION LIST

Patent Literature

Patent Literature 1: JP 2011/86497 A

SUMMARY OF THE INVENTION

When the toggle switch is connected to a control IC (Integrated Circuit) of an electronic device, e.g., the two fixed contacts of the toggle switch are connected, through their respective terminals, to two input terminals of a microcomputer. In case where an electronic device has plural toggle switches and, e.g., the control IC does not have enough input terminals, another control IC must be added or the existing control IC must be replaced with a control IC with a larger number of input terminals, hence, the size of the substrate on which the control IC is arranged increases and the downsizing of the device becomes difficult.

It is an object of the invention to provide a switch device that is substantially downsized.

An aspect of the invention provides a switch device, comprising:
- an operation unit to receive an operation performed by a user;
- a movable contact that is connected to a ground circuit and moves according to an operation performed on the operation unit;
- a plurality of fixed contacts whose state of connection to the movable contact is switched according to an operation position of the operation unit;
- a plurality of resistors connected in series in such a manner that one end is connected to a power supply, another end is connected to one of the plurality of fixed contacts, and a node formed by connecting in series is connected to the remaining of the plurality of fixed contacts; and
- a control unit that comprises an input terminal connected to a first node between the fixed contact connected closest to the power supply and the resistor and determines the operation position of the operation unit based on voltage detected through the input terminal.

Advantageous Effects of Invention

According to an embodiment of the invention, a switch device can be provided that is substantially downsized.

DETAILED DESCRIPTION OF THE INVENTION

Summary of Embodiments

A switch device in the embodiment generally includes an operation unit to receive an operation performed by a user, a movable contact that is connected to a ground circuit and moves according to an operation performed on the operation unit, plural fixed contacts whose state of connection to the movable contact is switched according to an operation position of the operation unit, plural resistors connected in series in such a manner that one end is connected to a power supply, another end is connected to one of the plural fixed contacts, and a node formed by connecting in series is connected to the remaining of the plural fixed contacts, and a control unit that includes an input terminal connected to a first node between the fixed contact connected closest to the power supply and the resistor and determines the operation position of the operation unit based on voltage detected through the input terminal.

The switch device uses only one input terminal of the control unit to determine plural operation positions of the operation unit. Therefore, as compared to when plural input terminals corresponding to respective operation positions are required, the switch device does not require an additional control unit or a replacement control unit with a larger number of input terminals and thus can be downsized.

Embodiment (General Configuration of a Switch Device 1)

Figure 1A:
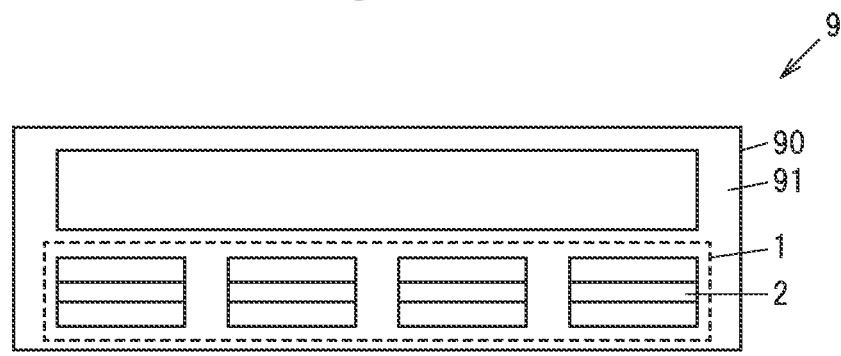
FIG. 1A is a front view showing an example of an electronic device on which a switch device is mounted.
Figure 1B:
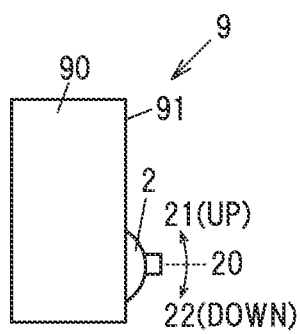
FIG. 1B is a side view showing the example of the electronic device.
Figure 1C:
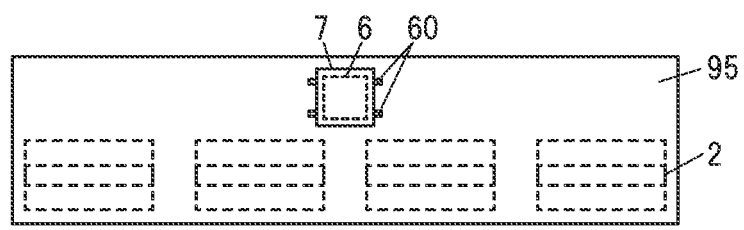
FIG. 1C shows an example of a substrate on which a control unit is arranged.
Figure 2:
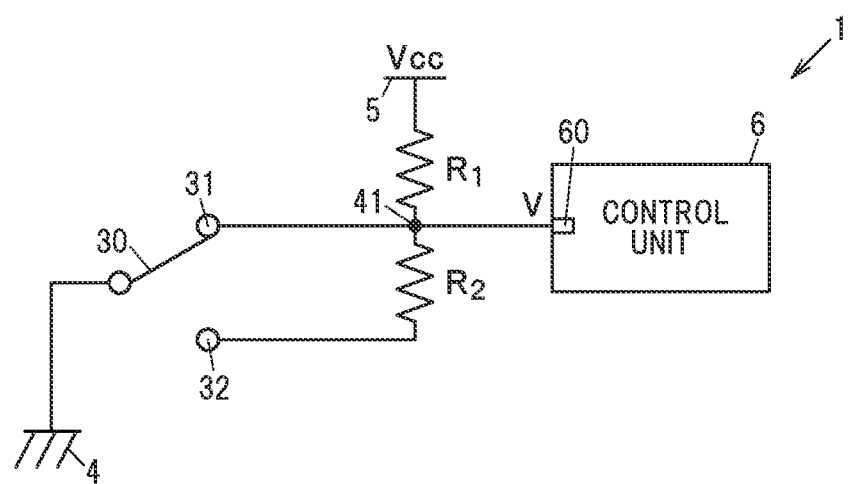
FIG. 2 is a diagram illustrating an example of the switch device.

FIG. 1A is a front view showing an example of an electronic device on which a switch device in the embodiment is mounted, FIG. 1B is a side view showing the example of the electronic device, and FIG. 1C shows an example of a substrate on which a control unit is arranged. FIG. 2 is a diagram illustrating an example of the switch device. In each drawing of the embodiment described below, a scale ratio or shape may be different from an actual ratio or shape.

As shown in FIGS. 1A and 1B, the switch device 1 in the present embodiment is arranged on an electronic device 9 mounted on a vehicle, as an example. As an example, the electronic device 9 is a vehicle control device that controls settings for the entire vehicle and self-driving functions, an air conditioner that adjusts temperature inside the vehicle, a navigation device that shows a map of the current location and guides to a destination, a display device that displays images, a seat device to control position and inclination of seats, and a music and video playback device to play back music and video, etc.

The electronic device 9 is configured such that the switch device 1 having plural operation units 2 is arranged on a front surface 91 of a housing 90, as shown in FIGS. 1A and 1B. Next, a circuit when the switch device 1 has one operation unit 2 will be described as an example. In case where there are plural operation units 2, circuits, each of which is the circuit from a ground circuit 4 to an input terminal 60 shown in FIG. 2, are provided according to the number of the operation units 2 and are connected to different input terminals 60 of the control unit 6.

As shown in FIGS. 1A to 2, the switch device 1 generally includes the operation unit 2 to receive an operation performed by a user, a movable contact 30 that is connected to the ground circuit 4 and moves according to an operation performed on the operation unit 2, plural fixed contacts whose state of connection to the movable contact 30 is switched according to an operation position of the operation units 2, plural resistors connected in series in such a manner that one end is connected to a power supply 5, the other end is connected to a second fixed contact 32 as one of the plural fixed contacts and a node formed by connecting in series is connected to the remaining of the plural fixed contacts, and a control unit 6 that has the input terminal 60 connected to a first node 41 between a first fixed contact 31 connected closest to the power supply 5 and a first resistor $R_1$ and determines the operation position of the operation unit 2 based on voltage V detected through the input terminal 60.

As an example, the operation positions in the present embodiment are a first operation position 21 (UP) and a second operation position 22 (DOWN), as shown in FIG. 1B. Therefore, there are two fixed contacts: the first fixed contact 31 on the first operation position 21 side and the second fixed contact 32 on the second operation position 22 side.

As shown in FIG. 2, the plural resistors in the present embodiment are the first resistor $R_1$ and a second resistor $R_2$. The first resistor $R_1$ and the second resistor $R_2$ may be formed by connecting plural resistors.

(Configuration of the Operation Unit 2)

As shown in FIGS. 1A and 1B, the operation unit 2 is supported by the housing 90 so as to be rotatable in an upward direction (UP) and a downward direction (DOWN). The operation unit 2 is configured to be located at a reference operation position 20 between the first operation position 21 and the second operation position 22 when no operation is performed. That is, the operation unit 2 is configured as a toggle switch that returns to the reference operation position 20 after being operated. However, it is not limited thereto. The operation unit 2 may be a slide switch that has plural operation positions.

The operation unit 2 is physically connected to the movable contact 30. That is, when the operation unit 2 is operated to the first operation position 21, the movable contact 30 is electrically connected to the first fixed contact 31. Likewise, when the operation unit 2 is operated to the second operation position 22, the movable contact 30 is electrically connected to the second fixed contact 32.

(Configuration of the Movable Contact 30, the First Fixed Contact 31 and the Second Fixed Contact 32)

The movable contact 30, the first fixed contact 31 and the second fixed contact 32 are formed using a conductive metal material.

The movable contact 30 is attached to the operation unit 2, as described above. As shown in FIG. 2, the first fixed contact 31 is electrically connected to the first node 41 between the first resistor $R_1$ and the second resistor $R_2$. The second fixed contact 32 is electrically connected to an end of the second resistor $R_2$ opposite to an end on the first resistor $R_1$ side.

(Configuration of the Ground Circuit 4)

The ground circuit 4 is a circuit that is electrically connected to the movable contact 30 and creates a potential reference for the switch device 1.

(Configuration of the Power Supply 5)

The power supply 5 is configured to apply power supply voltage $V_{CC}$ to the first resistor $R_1$. The power supply voltage $V_{CC}$ is 5V, as an example.

(Configuration of the First Resistor $R_1$ and the Second Resistor $R_2$)

The first resistor $R_1$ and the second resistor $R_2$ are connected in series in such a manner that one end is electrically connected to the power supply 5 and the other end is electrically connected to the second fixed contact 32.

The first resistor $R_1$ and the second resistor $R_2$ are configured to have the same resistance value. When the operation unit 2 is operated to the first operation position 21 (UP), the voltage V at the first node 41 is 0V which is the same potential as the ground circuit 4, since a circuit including the power supply 5, the first resistor Rr, the first fixed contact 31, the movable contact 30 and the ground circuit 4 is formed.

When the operation unit 2 is operated to the second operation position 22 (DOWN), the voltage V at the first node 41 is 2.5 V which is half the power supply voltage $V_{CC}$, since a circuit including the power supply 5, the first resistor Rr, the second resistor $R_2$, the second fixed contact 32, the movable contact 30 and the ground circuit 4 is formed and the resistance values are the same.

In this regard, when the resistance values of the first resistor $R_1$ and the second resistor $R_2$ are unequal, the voltage V when in the second operation position 22 is divided in proportion to the resistance values and is not half the supply voltage $V_{CC}$.

(Configuration of the Control Unit 6)

The control unit 6 is, e.g., a microcomputer composed of a CPU (Central Processing Unit) performing calculation and processing, etc., of the acquired data according to a stored program, and a RAM (Random Access Memory) and a ROM (Read Only Memory) as semiconductor memories, etc. The ROM stores, e.g., a program for operation of the control unit 6. The RAM is used as, e.g., a storage area to temporarily store calculation results, etc.

As an example, the control unit 6 is configured as a control IC 7 that is a semiconductor element, as shown in FIG. 1C. As an example, the electronic device 9 has four operation units 2, as shown in FIG. 1A. Thus, the control unit 6 has at least four input terminals 60, as an example.

The control unit 6 is also configured to perform A/D conversion to convert an analog signal input to the input terminal 60 into a digital signal.

The control unit 6 is configured to determine the first operation position 21 and the second operation position 22 based on drop in the power supply voltage $V_{CC}$ applied by the power supply 5 due to switching of connection of the movable contact 30 to the first fixed contact 31 and the second fixed contact 32.

As an example, when the control unit 6 detects the voltage V in a range of 0V+αV, the control unit 6 processes the input voltage V as a Lo signal and determines that the operation unit 2 is operated to the first operation position 21 (UP). As an example, α defines an allowable range with 0V as a reference, and is predetermined in a range of 0<α<2.5, preferably in a range of 0<α<1.

When, e.g., the control unit 6 detects the voltage V in a range of 2.5 V±βV, the control unit 6 processes the input voltage V as a Hi signal and determines that the operation unit 2 is operated to the second operation position 22 (DOWN). As an example, β defines an allowable range with 2.5V as a reference, and is predetermined so as not to overlap with the range of 0V+αV described above and so as not to be not less than 5V In this regard, the range of β does not need to have the same width from 2.5V, and may have different widths from 2.5V.

When the power supply voltage $V_{CC}$ applied by the power supply 5 is detected, through the input terminal 60, as voltage that is the same as said power supply voltage $V_{CC}$, the control unit 6 determines that it is in a connection state in which the movable contact 30 is not connected any of the first fixed contact 31 and the second fixed contact 32.

That is, in the diagram shown in FIG. 2, when the movable contact 30 is not connected to either the first fixed contact 31 or the second fixed contact 32, the voltage drop is small since the internal resistance of the control unit 6 is larger than the first resistor $R_1$, hence, the power supply voltage $V_{CC}$ is detected in the control unit 6.

When the voltage V detected through the input terminal 60 is 0V, the control unit 6 determines that a priority operation position of the operation unit 2, which is preliminarily given priority to be determined, has been detected. The priority operation position in the present embodiment is the first operation position 21.

The movable contact 30 is configured to not contact the first fixed contact 31 and the second fixed contact 32 at the same time. However, if the movable contact 30 and the first fixed contact 31 and the second fixed contact 32 are electrically continuous for some reason, the voltage V detected by the control unit 6 is 0V Therefore, when the movable contact 30 and the first fixed contact 31 and the second fixed contact 32 are electrically continuous, the control unit 6 determines that an operation to the first operation position 21 has been performed. This first operation position 21 is an operation position that has a small effect on the electronic device 9 even if an operation to this position is performed.

(Modification)

Figure 3:
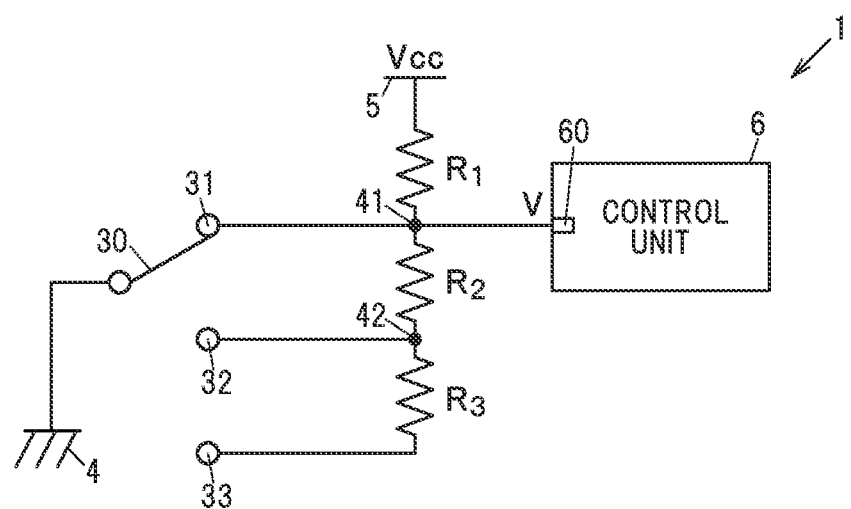
FIG. 3 is a diagram illustrating an example of the switch device in a modification.

FIG. 3 is a diagram illustrating an example of the switch device in a modification. As shown in FIG. 3, the switch device 1 in this modification includes first to third resistors $R_1$ to $R_3$ as the plural resistors. These first to third resistors $R_1$ to $R_3$ have the same resistance value, as an example.

The second fixed contact 32 is electrically connected to a second node 42 between the second resistor $R_2$ and the third resistor $R_3$. A third fixed contact 33 is electrically connected to an end of the third resistor $R_3$ opposite to an end connected to the second resistor $R_2$.

The operation unit 2 has first to third operation positions 21 to 23. At the third operation position 23, the movable contact 30 is electrically connected to the third fixed contact 33.

Since the resistance values of the first to third resistors $R_1$ to $R_3$ are the same, the voltage drops across the resistors are the same. That is, the power supply voltage $V_{CC}$ drops by one-third at each resistor. Thus, when in the third operation position 23, when the supply voltage $V_{CC}$ is 5V, the voltage V detected through the input terminal 60 is about 3.3V, as an example.

Effects of the Embodiment

The switch device 1 in the present embodiment can be downsized. In particular, the switch device 1 use the same input terminal 60 of the control unit 6 to determine plural operation positions of one operation unit 2. Therefore, as compared to when plural input terminals corresponding to respective operation positions are required, the switch device 1 does not require an additional control unit 6 or a replacement control unit with a larger number of input terminals and thus can be downsized.

When the switch device 1 has plural operation units 2, the control unit 6 having input terminals 60 corresponding to the number of operation units 2 can be used. Therefore, as compared to when each of plural operation units requires input terminals corresponding to different operation positions, it is possible to use a small control IC 7 in which the control unit 6 with fewer input terminals 60 is integrated, and it is also possible to downsize a substrate 95 on which the control IC 7 is arranged. The electronic device 9 on which the switch device 1 is arranged can be downsized since the switch device 1 having plural operation units 2 uses a small space on the substrate 95.

The switch device 1 is configured such that when the movable contact and the plural fixed contacts are turned on simultaneously due to a mechanical failure, etc., the position is determined to be the predetermined priority operation position, based on only the hardware configuration. Therefore, there is no need to implement measures on the software side and it is thereby possible to suppress the manufacturing cost.

Although some embodiment and modifications of the invention have been described, these embodiment and modifications are merely examples and the invention according to claims is not to be limited thereto. These new embodiment and modifications may be implemented in various other forms, and various omissions, substitutions and changes, etc., can be made without departing from the gist of the invention. In addition, not all combinations of the features described in these embodiment and modifications are necessary to solve the problem of the invention. Further, these embodiment and modifications are included within the scope and gist of the invention and also within the invention described in the claims and the range of equivalency.

REFERENCE SIGNS LIST

1 SWITCH DEVICE
2 OPERATION UNIT
4 GROUND CIRCUIT
5 POWER SUPPLY
6 CONTROL UNIT
9 ELECTRONIC DEVICE
20 REFERENCE OPERATION POSITION
21-23 FIRST TO THIRD OPERATION POSITIONS
30 MOVABLE CONTACT
31-33 FIRST TO THIRD FIXED CONTACTS
41 FIRST NODE
42 SECOND NODE
60 INPUT TERMINAL
$R_1$-$R_3$ FIRST TO THIRD RESISTORS
$V_{CC}$ POWER SUPPLY VOLTAGE

The invention claimed is:

1. A switch device, comprising:
an operation unit to receive an operation performed by a user;
a single movable contact that is connected to a ground circuit and moves according to an operation performed on the operation unit;
a plurality of fixed contacts whose state of connection to the movable contact is switched according to an operation position of the operation unit;
a plurality of resistors connected in series in such a manner that one end is connected to a power supply, another end is connected to one of the plurality of fixed contacts, and a node formed between two resistors of the plurality of resistors is connected to the remaining of the plurality of fixed contacts; and
a control unit that comprises an input terminal connected to a first node between the fixed contact connected closest to the power supply and a resistor and determines the operation position of the operation unit based on voltage detected through the input terminal,
wherein the single movable contact is moveable into operation positions corresponding to contact with each of the plurality of fixed contacts.

2. The switch device according to claim 1, wherein the control unit determines the operation position based on drop in power supply voltage applied by the power supply due to switching of connection of the movable contact to the plurality of fixed contacts.

3. The switch device according to claim 1, wherein when the power supply voltage applied by the power supply is detected, through the input terminal, as voltage that is the same as said power supply voltage, the control unit determines that it is in a connection state in which the movable contact is not connected any of the plurality of fixed contacts.

4. The switch device according to claim 1, wherein when voltage detected through the input terminal is 0V, the control unit determines that a priority operation position of the operation unit, which is preliminarily given priority to be determined, has been detected.

5. The switch device according to claim 1, wherein the plurality of resistors has a same resistance value.

6. The switch device according to claim 1, wherein the plurality of resistors has different resistance values.

7. The switch device according to claim 1, wherein a quantity of the input terminals is less than a number of the operation positions of the operation unit.

8. The switch device according to claim 1, wherein the operation unit is physically connected to the movable contact.

* * * * *